(12) United States Patent
Dautenhahn

(10) Patent No.: US 6,749,655 B2
(45) Date of Patent: Jun. 15, 2004

(54) FILTRATION OF FLUX CONTAMINANTS

(75) Inventor: Jon M. Dautenhahn, Linn Creek, MO (US)

(73) Assignee: Speedline Technologies, Inc., Franklin, MA (US)

( * ) Notice: Subject to any disclaimer, the term of this patent is extended or adjusted under 35 U.S.C. 154(b) by 67 days.

(21) Appl. No.: 10/125,100

(22) Filed: Apr. 17, 2002

(65) Prior Publication Data

US 2003/0196551 A1 Oct. 23, 2003

(51) Int. Cl.⁷ ................................................ B23K 1/12
(52) U.S. Cl. ..................... 55/385.1; 55/351.1; 55/467.1; 55/418.1; 55/410.1; 95/274; 95/288; 96/377; 96/414; 96/420; 96/421; 228/42; 34/77; 210/806; 210/690; 210/692; 210/693
(58) Field of Search ........................... 55/351.1, 385.1, 55/467.1, 410.1, 418.1; 95/274, 288; 96/377, 414, 420, 421; 228/42; 34/77; 210/806, 690, 692, 693

(56) References Cited

U.S. PATENT DOCUMENTS

| | | | |
|---|---|---|---|
| 1,936,078 A | * 11/1933 | Adamson | ...................... 95/274 |
| 2,947,383 A | * 8/1960 | Schytil et al. | ................. 95/274 |
| 5,037,454 A | * 8/1991 | Mann | ..................... 55/DIG. 17 |
| 5,481,087 A | 1/1996 | Willemen | |
| 5,579,981 A | 12/1996 | Matsumura et al. | |
| 5,611,476 A | 3/1997 | Soderlund et al. | |
| 5,641,341 A | 6/1997 | Heller et al. | |
| 5,769,010 A | 6/1998 | Orbeck | |
| 5,776,354 A | * 7/1998 | van der Meer et al. | ..... 210/806 |
| 5,911,486 A | 6/1999 | Dow et al. | |
| 5,913,589 A | 6/1999 | Dow et al. | |
| 5,993,500 A | 11/1999 | Bailey et al. | |
| 6,120,585 A | 9/2000 | Inomata et al. | |
| 6,146,448 A | 11/2000 | Shaw et al. | |
| 6,193,774 B1 | 2/2001 | Durdag et al. | |
| 6,245,133 B1 | * 6/2001 | Bourgeois | ..................... 96/414 |
| 853,559 A1 | * 5/2003 | Maignen et al. | .............. 95/274 |

FOREIGN PATENT DOCUMENTS

| | | |
|---|---|---|
| EP | 0 934 792 A2 | 8/1999 |
| EP | 0 999 007 A1 | 5/2000 |

OTHER PUBLICATIONS

International Search Report for PCT US 03/12018 mailed Jul. 29, 2003.

* cited by examiner

*Primary Examiner*—Minh-Chau T. Pham
(74) *Attorney, Agent, or Firm*—Lowrie Lando & Anastasi, LLP

(57) ABSTRACT

A two-stage filtration system is coupled with an oven, such as a solder reflow oven, to remove a vapor stream from the oven and to remove organic compounds that have volatilized from a solder flux and other contaminants from the vapor stream. The filtration system includes a first stage for trapping larger particles and a second stage including a packed bed of wettable media, such as steel balls, for trapping smaller particles and serving as a nucleation site for condensed organic compounds. The first stage can be a centrifugal self-cleaning element in the form of a mesh strainer coupled with a rotary motor for spinning the mesh strainer.

26 Claims, 4 Drawing Sheets

FILTRATION OF FLUX CONTAMINANTS

BACKGROUND

In the fabrication of circuit boards, electronic components are often surface mounted to a bare board via process known as "reflow soldering." In a typical reflow soldering process, a pattern of solder paste is deposited onto the circuit board, and the leads of one or more electronic components are inserted into the deposited solder paste. The circuit board is then passed through an oven where the solder paste is reflowed (i.e., melted) in heating zones and then cooled in a cooling zone to electrically and mechanically couple the leads of the electronic component to the circuit board. The term, "circuit board," as used herein, includes any type of substrate assembly of electronic components.

Solder paste typically includes not only solder, but also flux to promote solder wetting and to provide good solder joints. Other additives can also be included. After the solder paste is deposited on the circuit board, the circuit board is passed on a conveyor through a plurality of heating zones of a reflow soldering machine. As the solder paste melts, volatile organic compounds (referred to as "VOC's") in the flux and other additives are vaporized and tend to condense in the reflow machine. In many of the reflow furnaces, soldering is now performed in an inert atmosphere using primarily nitrogen to reduce oxidation on solder surfaces.

The heating zones are separated into a number of different zones, including preheat zones, soak zones and spike zones. In the preheat zones and the soak zones the products are heated and the volatile components in the flux vaporize in the surrounding gas atmosphere. The spike zones are hotter than the preheat and soak zones, and it is in the spike zones that the solder melts. A reflow soldering machine may have many heating zones, and these heating zones can be varied depending on the products to be soldered. Different products require different heat profiles, and a soldering machine should be flexible so that, for example, a machine with ten heating zones may have one preheat zone followed by seven soak zones and two spike zones for one type of circuit board, and for a different type of board may have three preheat zones, six soak zones and one spike zone. One or more cooling zones follow the heating zones; in the cooling zones, the solder solidifies on the solder areas of the board.

If volatilized compounds pass from the heating zones into the cooling zones, those compounds typically will condense in the cooling zones; and the condensate can impair cooling functions and may present processing problems. The most common problem occurs with no-clean, enhanced-print-performance solder pastes. These pastes utilize viscosity modifiers to achieve superior printing performance. Problems arise when the viscosity-modification components condense in the cooling zones. By nature, these residues are a viscous liquid and can build up and drip onto the soldered product from the cooling zone surfaces, such as heat exchangers, etc.

Known methods for removing these volatilized organic compounds typically employ heat exchangers that cool a hot gas stream removed from a process chamber and thereby condense organic compounds in the gas stream on a surface of the heat exchanger. The condensate can then be removed with a condensate filter before the gas stream is returned to the process chamber.

SUMMARY

In accordance with methods and apparatus disclosed, herein, volatilized organic compounds and other contaminants (e.g., particulates) released in a soldering operation can be removed using a two-stage filtration system including a first stage that traps larger particles in a vapor stream and a second stage including a packed bed of wettable media that traps smaller particles and serves as a nucleation site for condensed organic compounds in the vapor stream.

The two-stage filtration system is particularly useful when coupled with a reflow oven wherein a circuit board is passed through a heated reflow chamber to reflow (i.e., melt) solder paste on the circuit board, thereby volatilizing organic compounds from the flux or other additives in the solder paste. At least a portion of the volatilized organic compounds pass from the reflow chamber through a first stage and then to a second stage of the filtration system.

The first stage is designed to trap larger particles in the vapor stream from the reflow chamber. The second stage includes a packed bed of wettable media designed to trap smaller particles and to serve as a nucleation site for volatilized organic compounds.

In one embodiment, the first stage includes a mesh strainer. The mesh strainer or other filtering element can be employed as a centrifugal self-cleaning element by, for example, coupling the filtering element to a rotary motor that spins the filtering element to centrifugally expel the filtered contaminants from its surface.

Embodiments of the invention can offer some or all of the following advantages. First, the filtration system can yield high collection efficiency, thereby reducing excessive build-up of contaminants within the oven and consequent potential for damage to oven components and/or to the circuit board assemblies passing therethrough if, for example, the condensed flux was to drop onto the assemblies. Second, the filtration system can effectively remove particulate and volatilized contaminants without employing an active-cooling mechanism, such as a heat exchanger; consequently, the filtration system can conserve energy relative to known systems and can minimize facilities requirements (e.g., exhaust, chilled water, compressed gas, etc.). Third, a centrifugal self-cleaning element can be used in the first stage of the filtration system to easily clean the first stage without any additional mechanical or human intervention and with little disruption to the filtration process. Fourth, unlike systems relying solely upon condensation, systems described herein also remove solid particulates entrained in the vapor stream. Fifth, temperatures can remain high in the system because active cooling is not needed, thereby allowing collected contaminants to retain a low viscosity and to drip into easily disposable drain jars. Sixth, the overall simplicity and effectiveness of the system reduces maintenance costs and lost production due to machine downtime.

Figure 1:
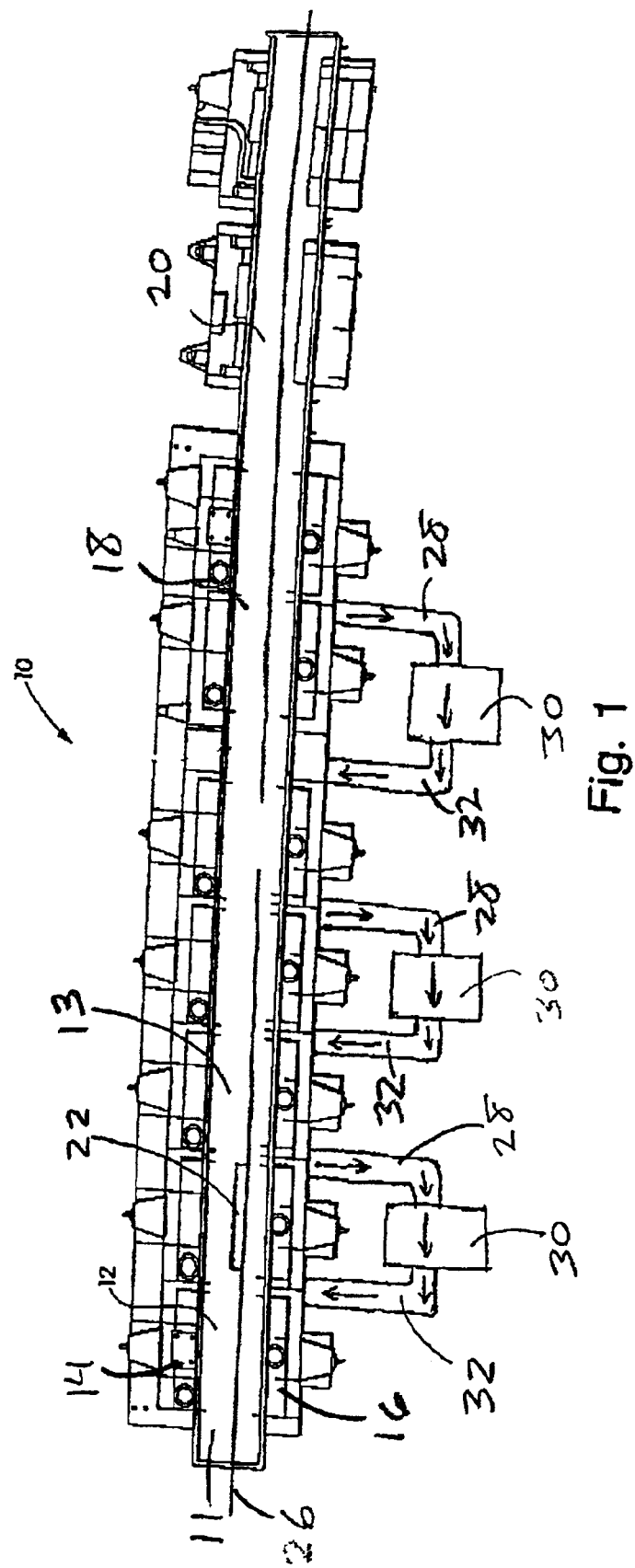
FIG. 1 is a schematic view showing a two-stage filtration system coupled with a reflow soldering oven.

The foregoing and other features and advantages of the invention will be apparent from the following, more-particular description. In the accompanying drawings, like reference characters refer to the same or similar parts throughout the different views. The drawings are not necessarily to scale, emphasis instead being placed upon illustrating particular principles, discussed below.

DETAILED DESCRIPTION

The description that follows is directed primarily to the use of a two-stage filtration in conjunction with a reflow soldering machine. Although the two-stage filtration system is particularly useful in reflow soldering applications, embodiments of the two-stage filtration system can also be employed in other applications. Within the context of circuit board assembly, the two-stage filtration system can alternatively be used to filter similar flux residues emitted from other types of soldering apparatus, such as a wave-soldering device.

Solder paste is routinely used in the assembly of circuit boards, where it is used to join electronic components to the board. Solder paste includes solder for joint formation and flux for preparing metal surfaces for solder attachment; the solder paste can be deposited on the circuit board by using a squeegee to force the solder paste through a metallic stencil laid over an exposed circuit board surface. Leads of the electronic component are aligned with and impressed into the solder deposits to form the assembly. In reflow solder processes, the solder is then reflowed and cooled to permanently couple the electronic component, both electrically and mechanically, to the circuit board. The solder typically includes an alloy having a melting temperature lower than that of the metal surfaces to be joined. The alloy is often a tin-lead alloy.

The flux typically includes a vehicle, solvent, activators and other additives. The vehicle is a solid or nonvolatile liquid that coats the surface to be soldered and can include rosin, resins, glycols, polyglycols, polyglycol surfactants, and glycerine. The solvent, which evaporates during the preheat and soldering process, serves to dissolve the vehicle, activators, and other additives. Examples of typical solvents include alcohols, glycols, glycol esters and/or glycol ethers. The activator enhances the removal of metal oxide from the surfaces to be soldered. Common activators include amine hydrochlorides; dicarboxylic acids, such as adipic or succinic acid; and organic acids, such as citric, malic or abietic acid. Other flux additives can include surfactants, viscosity modifiers and additives for providing low slump or good tack characteristics for holding the components in place before reflow.

One embodiment of a reflow soldering apparatus 10 for soldering the circuit board assembly is shown in FIG. 1. The apparatus 10 includes a chamber in the form of a thermally insulated tunnel 11 defining a passage for preheating, reflowing and then cooling solder on a circuit board passing therethrough. The tunnel 11 extends across a plurality of heating zones including two preheat zones 12 followed by three soak zones 13, each zone comprising top 14 and bottom 16 heating elements. The soak zones 13 are followed by two spike zones 18, which likewise include heating elements. Finally, two cooling zones 20 follow the spike zones 18.

A circuit board assembly 22, including deposited solder and electronic components, is passed (left-to-right in FIG. 1) through each zone 12, 13, 18 and 20 of the thermally insulated tunnel 11 on a fixed-speed conveyor 26, thereby enabling controlled and gradual preheat, reflow and post-reflow cooling of the circuit board assembly 22. The heating elements 14, 16 can be in the form, for example, of resistance heaters that heat the circuit board assembly 22 via convection heating. In the preliminary preheat zones 12, the board is heated from ambient temperature up to the flux activation temperature, which can be in the range of about 130° to about 150° C.

In the soak zones 13, variations in temperature across the circuit board assembly 22 are stabilized and time is provided for the activated flux to clean the component leads, land pads and solder powder before reflow. Additionally, volatile components in the flux are vaporized. The temperature in the soak zones 13 is typically about 140° to about 160° C., and the circuit board assembly 22 can spend about 30 to about 45 seconds passing through the soak zones 13.

In the spike zones 18, the temperature quickly ramps up to a temperature above the melting point of the solder to reflow the solder. The melting point for eutectic or near-eutectic tin-lead solder is about 183° C.; and the reflow spike is typically set about 25° to about 50° C. above the melting point to overcome the pasty range of molten solder. A typical maximum temperature in the spike zones 18 is in the range of about 200° to about 220° C. Temperatures above about 225° C. can cause baking of the flux, damage to components and/or sacrifice in joint integrity. Temperatures below about 200° C. can prevent the joints from fully reflowing. The circuit board assembly 22 is typically maintained at a temperature above the reflow temperature for about one minute.

Finally, in the cooling zones 20, the temperature drops below the reflow temperature, and the circuit board assembly 22 is cooled sufficiently to solidify the joints and thereby preserve joint integrity before the assembly 22 leaves the tunnel 11.

An input gas duct 28 is shown exiting between the second preheat zone 12 and first soak zone 13, then passing through a filtration system 30 and into an output gas duct 32. The output gas duct 32 reconnects with the tunnel 11 between the first and second preheat zones 12. In operation, a vapor stream is withdrawn from the tunnel 11 through input gas duct 28, through the filtration system 30, then through the output gas duct 32 and back to the tunnel 11. Similar constructions of input gas ducts 28, filtration systems 30 and output gas 32 ducts are likewise positioned to withdraw vapor streams from between the second and third soak zones 13 and from between the first and second spike zones 18.

The filtration systems 30 do not rely on active cooling to condense vaporized organic compounds; and, in fact, active-cooling mechanisms, such as heat exchangers, can be entirely absent from the systems 30. Consequently, it is advantageous to segregate vapor streams of differing temperatures that are withdrawn from different positions along the length of the tunnel 11 to separate filtration systems 30. If, for example, a high-temperature vapor stream is withdrawn from a spike zone 18 and mixed with a lower-temperature vapor stream from a preheat zone 12 or soak zone 13 in a filtration system 30, effluents that are condensed and filtered from the lower-temperature vapor stream can be re-vaporized by the high-temperature vapor stream, thereby reducing the efficiency of the system 30. The three filtration systems 30 illustrated in FIG. 1 accordingly offer separate filtration from three different regions of the tunnel 11. Withdrawing vapor streams from different sections of the tunnel 11 also promotes greater capture of contaminants because each zone in the tunnel 11 is independently temperature-controlled, and different components of the solder paste burn off in different zones.

Figure 2:
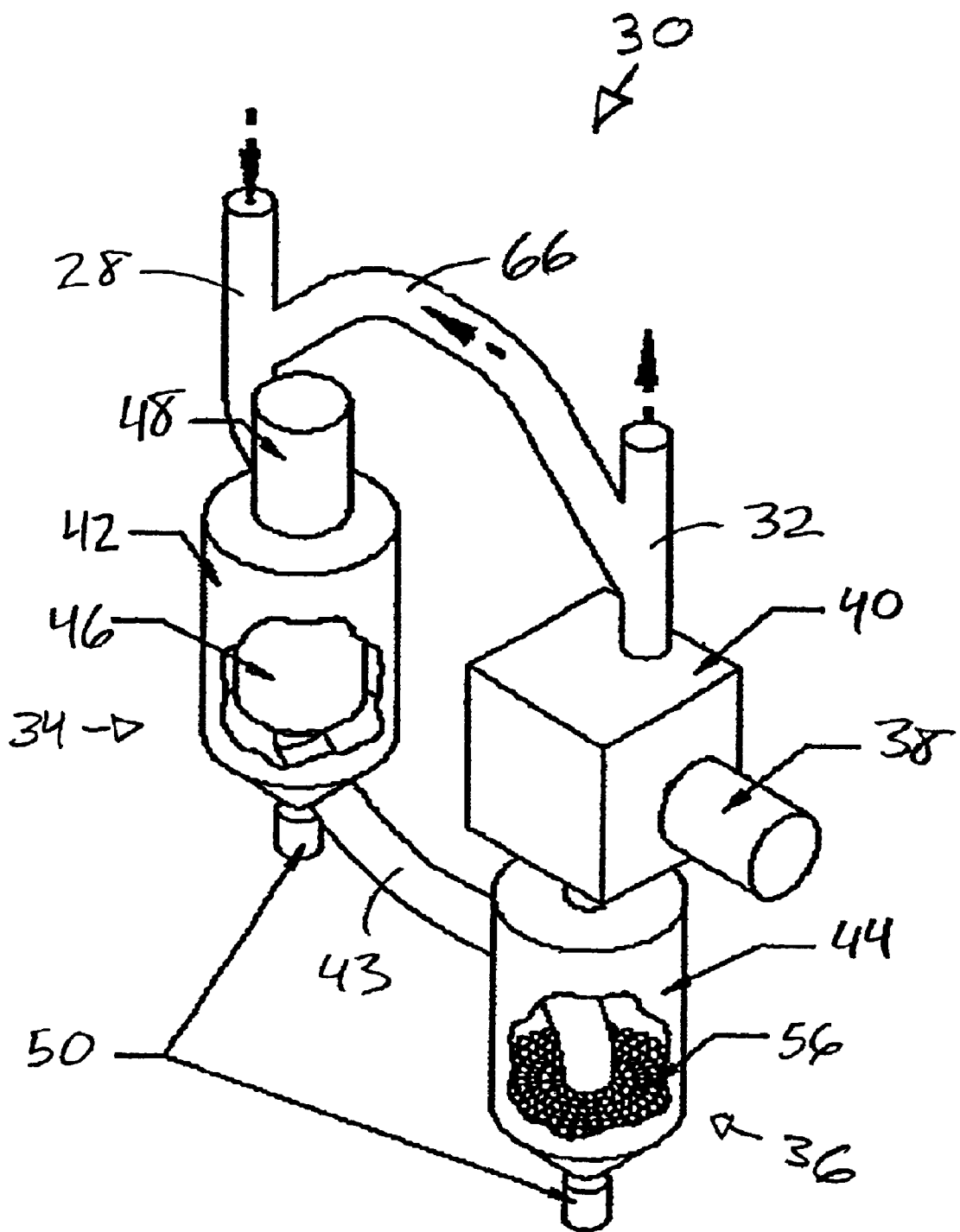
FIG. 2 is a partial-cutaway perspective view of an embodiment of the two-stage filtration system.
Figure 3:
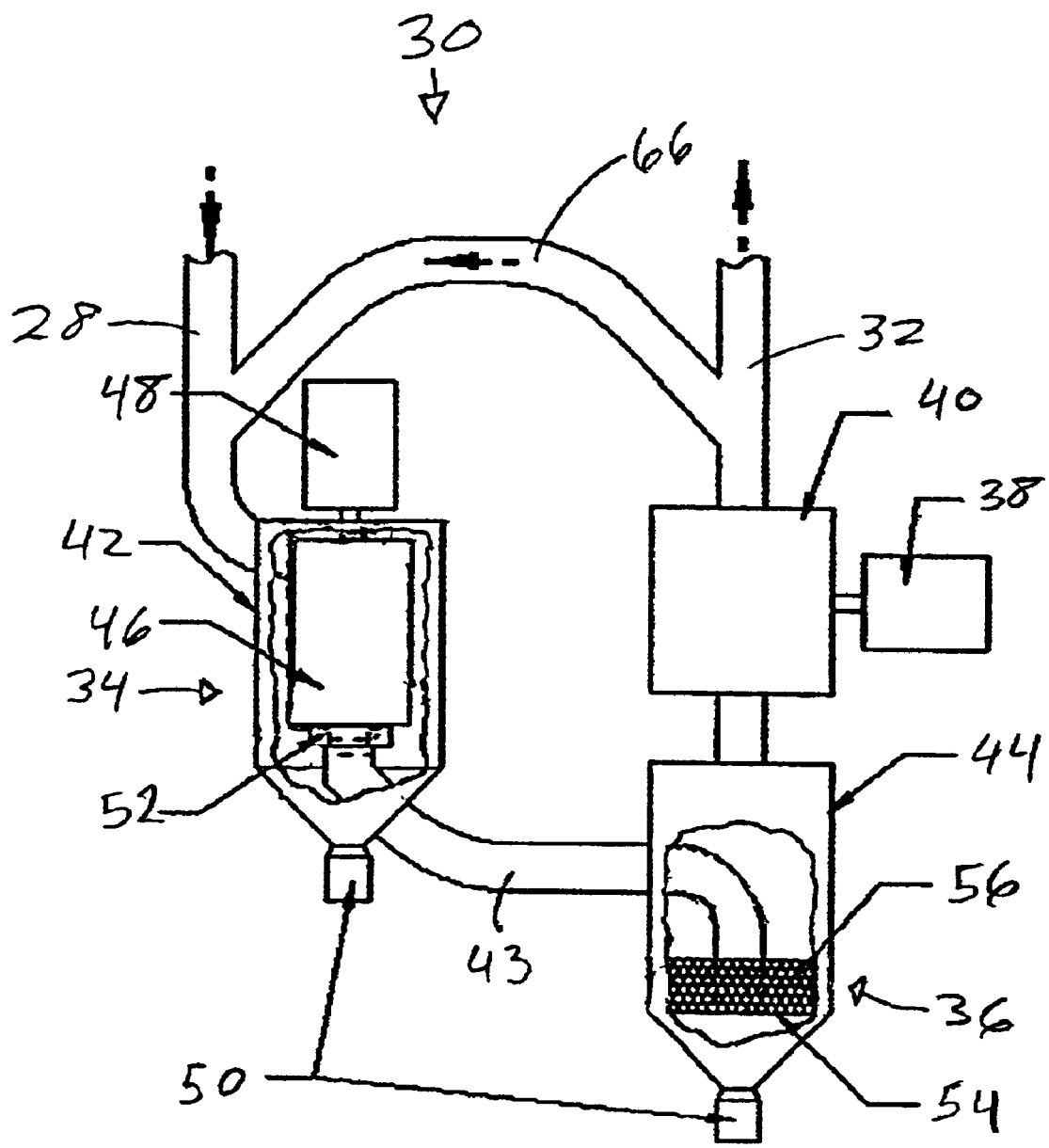
FIG. 3 is a partial-cutaway perspective view of the two-stage filtration system of FIG. 2 from another perspective.

As shown, in FIGS. 2 and 3, each filtration system 30 includes a first stage 34 and a second stage 36. An air-moving blower 38 and blower housing 40 are provided to circulate a vapor stream from input gas duct 28 through first stage 34, then through connecting duct 43, through second stage 36, and then finally through output gas duct 32 on its way back to the tunnel 11. The blower 38 can be similar to the convection blowers that are employed in the chamber of the reflow apparatus 10 and can provide, for example, 25 standard cubic feet per minute (scfm) of gas flow (0.7 standard cubic meters per minute). The ducts can be made of stainless steel and are designed so that any film collected on the walls of the ducts will drain into the housing 42, 44 of the first or second stage 34, 36.

In the first stage 34, the vapor stream should enter the housing 42 such that it does not directly hit only a small portion of the strainer 46. Configuring the input gas duct 28 to direct the vapor stream to enter from a direction approximately tangential to the housing 42 will allow near-uniform heating and collection of contaminants in the vapor stream. The vapor stream expands and increases in pressure as it enters the housing 42, thereby causing volatilized organic compounds to condense as droplets; the larger droplets fall out of the vapor stream. The remainder of the vapor stream entering the housing 42 passes through the strainer 46. In one embodiment, the strainer 46 is a pleated steel (e.g., stainless steel) mesh with openings of 74 $\mu$m (200 mesh) or finer and with crimped and welded ends. The size of the openings in the strainer 46 can be varied depending upon the allowable interval between cleaning; with frequent cleaning intervals, the openings can be finer. Micronic cloths that are typically used in hydraulic fluid applications can be used as the strainer 46.

The strainer 46 can have a cylindrical shape with the vapor stream passing from the outside to the inside of the cylinder. When filtering a vapor stream from the tunnel 11 of the reflow oven (see FIG. 1), the strainer 46 entraps particles, particularly metal, resin and rosin particles entrained in the vapor stream. The vapor stream is then further drawn from inside the strainer 46 out the first stage via connecting duct 43, while the particles remain attached to the exterior of the strainer 46. The first stage 34 thereby eliminates the build-up of highly viscous, sticky and difficult-to clean residue downstream in the system 30.

The strainer 46 is centrifugally self-cleaning. A rotary-drive motor 48 is coupled with the strainer 46 to periodically spin the strainer 46 about its axis. The speed of rotation is sufficient for the centrifugal force of rotation on the filtered build-up to overcome adhesive forces to the external surface of strainer 46 to throw the build-up outward to the walls of the housing 42. Because the filtration system 30 does not incorporate active cooling (e.g., no heat exchanger), the system 30 remains warmed by the chamber gasses passing therethrough; consequently, the viscosity of liquids adhered to the walls of the housing 42 is lowered, and the liquids are allowed to run down the walls and into a drain jar 50 at the bottom of the housing. A switch can be provided at the drain jar 50 (and at the corresponding drain jar 50 in the second stage 36) to warn of the need to replace the drain jar 50.

The rotary-drive motor 48 can also be coupled with a switch for detecting vapor pressure or flow through the system 30. If the detected vapor pressure in the system 30 is above a threshold limit, or if the vapor flow is too low, the switch triggers the motor 48 to turn on. This cleaning procedure can be performed at the relatively high operating temperature of the system 30 to reduce contaminant viscosity and facilitate the release of the contaminants from the surface of the strainer 46 when the strainer 46 is spun.

The connecting duct 43 is coupled with the base of the strainer 46 in the first stage 42 via an arrangement of bearings 52 including a thrust bearing, a ball bearing and a bearing seat to enable rotation of the strainer 46 while the connecting duct 43 remains fixed.

The second stage 36 traps smaller particles and serves as a nucleation site for organic compounds. The vapor stream enters the second stage 36 through connecting duct 43. The connecting duct 43 enters the housing 44 of the second stage 36 and ends at a perforated plate 54. The perforated plate 54 also supports the packed bed of wettable media 56, which surround the lower end of the connecting duct 43. The vapor stream flows out of the connecting duct 43, through the perforated plate 54 and then undergoes an expansion as it fills the lower region of the housing 44 causing an increase in droplet size of small, lightweight droplets mainly comprising alcohol and solvent. The vapor stream then flows back through the perforated plate 54 and up through the packed bed of wettable media 56.

The media is "wettable" for the liquid contaminants present in the vapor stream. Media are considered to be "wettable" for a contaminant if droplets of the contaminant can adhere and spread across the surface of the media upon impact. Conversely, if a material is non-wettable, droplets will rebound off of its surface upon impact. The media can be in the form of a packed bed of round balls, which provide high wettable surface area and a tortuous pathway for a vapor stream passing therethrough. In one embodiment, the media is formed of steel (e.g., stainless steel), though other materials, such as borosilicate glass, can be used as long as they provide a wettable surface and can withstand the high temperatures of the vapor stream.

In a particular embodiment, the packed bed comprises 1250 $\frac{5}{16}$-inch (about 8-mm) diameter steel balls at a depth of about 2 inches (about 5 cm). Increasing the depth of the bed will improve collection but will produce a greater pressure drop across the packed bed. The steel balls can have clean surfaces; they need not be coated with a complex chemistry to absorb the contaminants in the vapor stream.

Figure 4:
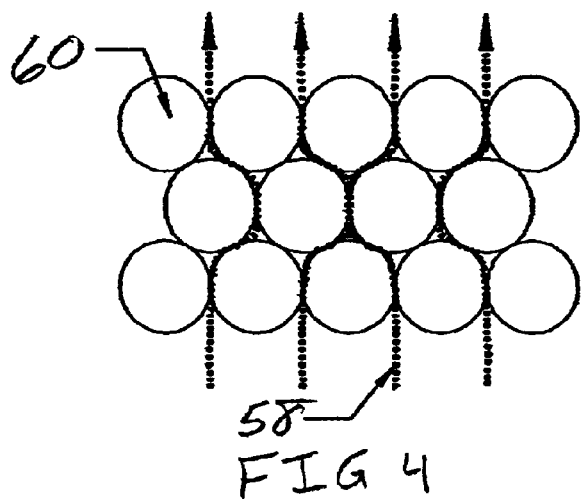
FIG. 4 illustrates the flow path of a vapor stream through a packed bed of wettable balls in the second stage of the filtration system of FIGS. 2 and 3.
Figure 5:
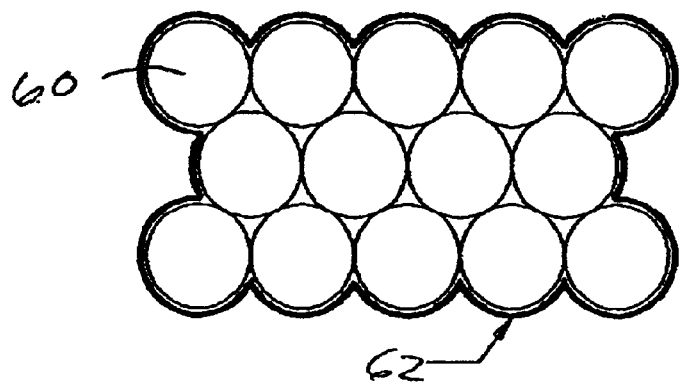
FIG. 5 illustrates formation of a film of contaminants removed from a vapor stream on the wettable balls of FIG. 4.
Figure 6:
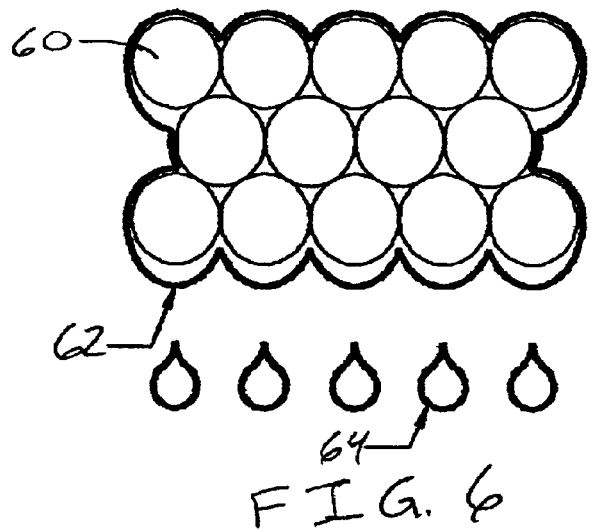
FIG. 6 illustrates formation of droplets from the contaminant film of FIG. 5.

The flow path 58 of the vapor stream as it passes through the packed bed of steel balls 60 is illustrated in FIG. 4. Contaminants in the vapor stream may undergo multiple collisions with the wettable balls 60, increasing the likelihood that condensed organic compounds in the vapor stream will nucleate on the surface of the wettable balls 60. Initially, a film 62 of the condensed organic compounds forms via heterogeneous nucleation of droplets on the ball surfaces, as shown in FIG. 5. When the film 62 spreads to cover the balls 60, nucleation of the organic compounds is homogeneous, and droplets 64 of the organic compounds begin to form.

Under the effects of gravity, the liquid film 62 on the balls 60 forms at least one droplet 64 that builds in size until its weight overcomes the cohesion forces, and the droplet 64 separates from the film 62 and falls to the bottom of the housing 44 and into the drain jar 50. Since the first stage 34 removes the heavy particles, the liquid collected in the second stage 36 has a very low viscosity, about the same as the viscosity of water; so there is no continual buildup of residue or liquid beyond the initial film 62 on the balls 60.

After passing through the packed bed 56, the vapor stream exits through output gas duct 32 from the top of the housing 44. The output gas duct 32 leads back to the tunnel 11, where the vapor stream re-enters the chamber. A portion of the exiting vapor stream is redirected via a re-circulation bypass back to the input gas duct 28 where the redirected vapor stream joins the entering vapor stream and is passed back through the first and second stages 34, 36. Multiple passes through the system 30 increase the collection efficiency. In one embodiment, the re-circulation bypass 66 returns about 50% of the vapors passing through the system to the first stage 34 to be passed back through the first and second stages 34, 36.

Accordingly, the filtering capabilities of the first stage 34, second stage 36 and other components of the filtration system 30 combine to remove volatile organic compounds and other contaminants emitted from solder paste in a reflow solder oven without use of an active-cooling mechanism. Because volatile organic compounds and other contaminants are removed from the hot zones 12, 13, 18 of the reflow tunnel 11, circuit board assemblies 22 can be delivered via the conveyor 26 into the cooling zones 20 with reduced concentrations of volatile organic compounds and other contaminants and, consequently, reduced potential for damage to the circuit board assembly 22 and components within the tunnel 11 due to contamination and residue build-up.

While this invention has been shown and described with references to particular embodiments thereof, those skilled in the art will understand that various changes in form and details may be made therein without departing from the scope of the invention, which is limited only by the following claims.

What is claimed is:

1. A reflow apparatus for solder joining electronic components to circuit boards, the apparatus comprising:
   a reflow chamber;
   a conveyor for conveying a circuit board within the chamber;
   at least one heating element for providing heat to reflow solder on the circuit board; and
   at least one two-stage filtration system for removing contaminants, the filtration system coupled with the chamber for passage of a vapor stream from the chamber through the filtration system, the filtration system including:
      a first stage including a housing and a mesh strainer mounted within the housing, wherein the mesh strainer is designed to trap larger particles; and
      a second stage including a packed bed of wettable media designed to trap smaller particles and to serve as a nucleation site for condensed organic compounds.

2. The reflow apparatus of claim 1, further comprising a drain jar coupled with each stage for collecting filtered particles.

3. The reflow apparatus of claim 1, wherein the mesh strainer is formed of steel.

4. The reflow apparatus of claim 1, wherein the mesh strainer is part of a centrifugal self-cleaning element.

5. A reflow apparatus, for solder joining electronic components to circuit boards, the apparatus comprising:
   a reflow chamber;
   a conveyor for conveying a circuit board within the chamber;
   at least one heating element for providing heat to reflow solder on the circuit board; and
   at least one two-stage filtration system for removing contaminants, the filtration system coupled with the chamber for passage of a vapor stream from the chamber through the filtration system, the filtration system including:
      a first stage including a housing and a mesh strainer mounted within the housing, wherein the mesh strainer:
         is designed to trap larger particles;
         is part of a centrifugal self-cleaning element; and
         is coupled with a motor for spinning the mesh strainer; and
      a second stage including a packed bed of wettable media designed to trap smaller particles and to serve as a nucleation site for condensed organic compounds.

6. The reflow apparatus of claim 5, further comprising a switch for detecting vapor pressure or flow in the system, wherein the switch is coupled with the motor for spinning the mesh strainer.

7. The reflow apparatus of claim 1, wherein the wettable media are in the form of balls.

8. The reflow apparatus of claim 7, wherein the wettable media are free of a distinct coating for absorbing vapors.

9. The reflow apparatus of claim 8, wherein the wettable media are formed of steel.

10. The reflow apparatus of claim 1, further comprising a re-circulation bypass for returning a portion of the vapor stream that has passed through the first and second stages back to the first stage.

11. The reflow apparatus of claim 1, wherein the system is free of an active-cooling mechanism for cooling the vapor stream.

12. The reflow apparatus of claim 1, wherein a plurality of two-stage filtration systems, as described in claim 1, are coupled with the chamber at respective positions to remove vapor streams at different temperatures.

13. A method for removing vaporized contaminants from inside a reflow oven, the method comprising:
   extracting a vapor stream including vaporized flux components from a reflow oven;
   passing the vapor stream through a first-stage filter that includes a housing and a mesh strainer mounted within the housing, wherein the mesh strainer traps larger particles in the vapor stream; and then
   passing the vapor stream through a second-stage filter including a packed bed of wettable media that traps smaller particles and serves as a nucleation site for condensed organic compounds in the vapor stream.

14. The method of claim 13, wherein the packed bed of wettable media removes organic compounds from the vapor stream by nucleation of the organic compounds on a surface of the wettable media.

15. The method of claim 14, wherein the nucleated organic compounds on the surface of the wettable media forms a liquid coating that flows from the wettable media such that the wettable media are self-cleaning.

16. The method of claim 15, wherein the wettable media are in the form of balls.

17. The method of claim 13, wherein the vapor stream expands when it enters the first-stage housing causing vapor to condense as droplets.

18. The method of claim 17, wherein the vapor stream again expands after passing through the mesh strainer and before passing through the packed bed of wettable media.

19. A method for removing vaporized contaminants from inside a reflow oven, the method comprising
   extracting a vapor stream including vaporized flux components from a reflow oven;

passing the vapor stream through a first-stage filter that includes a housing and a mesh strainer mounted within the housing, wherein the mesh strainer traps larger particles in the vapor stream;

passing the vapor stream through a second-stage filter after the stream passes through the first-stage filter, wherein the second-stage filter includes a packed bed of wettable media that traps smaller particles and serves as a nucleation site for condensed organic compounds in the vapor stream; and spinning the mesh strainer to release particles adhered to the mesh strainer.

20. The method of claim 13, further comprising the step of returning a portion of the vapor stream that has passed through the first and second stages back to the first stage.

21. The method of claim 13, wherein the vapor stream is not actively cooled.

22. A soldering apparatus for joining electronic components to circuit boards, the apparatus comprising:

an oven;

a support structure for supporting a circuit board within the oven;

at least one heating element for heating a circuit board within the oven; and at least one two-stage filtration system for removing contaminants, the filtration system configured to extract a vapor stream from the oven, and the filtration system including:

a first stage including a housing and a mesh strainer mounted within the housing, wherein the mesh strainer is designed to trap larger particles; and a second stage including a packed bed of wettable media designed to trap smaller particles and to serve as a nucleation site for condensed organic compounds.

23. The soldering apparatus of claim 22, wherein the first stage includes a centrifugal self-cleaning element.

24. A soldering apparatus for joining electronic components to circuit boards, the apparatus comprising:

an oven;

a support structure for supporting a circuit board within the oven;

at least one heating element for heating a circuit board within the oven; and at least one two-stage filtration system for removing contaminants, the filtration system configured to extract a vapor stream from the oven, and the filtration system including:

a first stage designed to trap larger particles, wherein the first stage includes a centrifugal self-cleaning element that includes a motor and a strainer, wherein the motor is coupled with the strainer to spin the strainer; and a second stage including a packed bed of wettable media designed to trap smaller particles and to serve as a nucleation site for condensed organic compounds.

25. The soldering apparatus of claim 24, further comprising a switch for detecting vapor pressure or flow in the system, wherein the switch is coupled with the motor for spinning the strainer.

26. The reflow apparatus of claim 22, wherein the system is free of an active-cooling mechanism for cooling the vapor stream.

* * * * *